United States Patent [19]

Dietrich et al.

[11] Patent Number: 5,940,424
[45] Date of Patent: Aug. 17, 1999

[54] SEMICONDUCTOR LASERS AND METHOD FOR MAKING THE SAME

[75] Inventors: Hans Peter Dietrich, Adliswil; Marcel Gasser, Zurich; Abram Jakubowicz, Rueschlikon; Ernst-Eberhard Latta, Adliswil; Peter Roentgen, Thalwil, all of Switzerland

[73] Assignee: International Business Machines Corporation, Armonk, N.Y.

[21] Appl. No.: 08/721,072

[22] Filed: Sep. 26, 1996

[30] Foreign Application Priority Data

Jun. 24, 1996 [GB] United Kingdom ................ 96110150

[51] Int. Cl.⁶ ....................................... H01S 3/19
[52] U.S. Cl. ................................. 372/49; 372/45
[58] Field of Search ........................... 372/49, 45

[56] References Cited

U.S. PATENT DOCUMENTS

| | | | |
|---|---|---|---|
| 4,092,659 | 5/1978 | Ettenberg | 372/49 |
| 4,731,792 | 3/1988 | Shimizu et al. | 372/49 |
| 4,951,291 | 8/1990 | Miyauchi et al. | 372/49 |
| 4,975,922 | 12/1990 | Sakane et al. | 372/49 |
| 5,063,173 | 11/1991 | Gasser et al. | 437/129 |
| 5,497,389 | 3/1996 | Kasukawa et al. | 372/49 |

FOREIGN PATENT DOCUMENTS 0363547  12/1988  European Pat. Off. .

OTHER PUBLICATIONS

A. Moser et al, Thermodynamics approach to catastrophic optical mirror damage of AlGaAs single quantum well lasers, Appl.Phys.Lett.55(12), Sep. 18, 1989, pp. 1152–1154.

High–Power Ridge–Waveguid AlGaAs Grin–Sch Laser Diode, Electronics Letters Sep. 25, 1986 vol. 22 No. 20.

*Primary Examiner*—Rodney Bovernick
*Assistant Examiner*—Yisun Song
*Attorney, Agent, or Firm*—McGinn & Gibb, P.C.

[57] ABSTRACT

A semiconductor laser diode, and a method for producing the semiconductor laser diode, includes a waveguide being terminated by a back facet and a front facet and a front facet coating and a back facet coating having a reflectivity providing for controlled decoupling of light at the front facet from the standing lightwave in the waveguide. The front facet coating includes a stack of layers providing for a phase shift of the standing lightwave within the waveguide such that the intensity of the lightwave at the front facet, where the light is decoupled from the standing lightwave, has a relative minimum.

16 Claims, 3 Drawing Sheets

SEMICONDUCTOR LASERS AND METHOD FOR MAKING THE SAME

TECHNICAL FIELD

The invention concerns a method for the application of special layers on the facets of semiconductor laser diodes for reduction of catastrophic optical mirror damage (COMD). Furthermore, it concerns semiconductor laser diodes comprising such special layers.

BACKGROUND OF THE INVENTION

Semiconductor laser diodes have found applications in a wide variety of information handling systems because of their compact size and because their technology is compatible with that of the associated electronic circuitry. They are being employed in areas such as data communications, optical storage and optical printing. Most commonly used are group III/V compound materials. Particularly AlGaAs lasers have found extensive usage.

Historically, the mirror facets have been obtained by cleaving the laser bars, i.e., layered structures forming the active waveguide of the device. Cleaving usually provides single, often high quality devices which require, however, further individual processing and testing. More recently, there is a strong trend to increase the scale of integration which requires the replacement of at least one cleaved mirror facet of the laser diodes by an etched mirror. Since substantial progress has been made in obtaining good quality etched mirrors, this technology is very promising. It allows processes like mirror coating and testing to be performed on the wafer level—with the benefit of reduced handling, increased yield, and decreased fabrication and testing costs.

For both types of lasers, i.e., those with cleaved and those with etched mirrors, one of the most important and critical device reliability criteria is the reliability and thus the maximum lifetime of the device at the output power levels required for the various applications. Reliability and device lifetime are heavily affected by mirror contamination and degradation which lead to device heating and finally to device destruction.

Over a long period of time, in fact for more than 15 years, proposals and attempts have been made trying to solve these problems. Most successful has been the coating of the mirror facets with passivation layers which are applied to protect the mirror surfaces against contamination during the lifetime of the device. For this standard passivation the power dissipated at the mirror turned out to be responsible for a gradual degradation close to the facet. This degradation may lead to a catastrophic optical mirror damage (COMD), as described in "Thermodynamics approach to catastrophic optical mirror damage of AlGaAs single quantum well lasers", A. Moser, E.-E. Latta, D. J. Webb, Applied Physical Letters, Vol. 55, No. 12, p. 1152, 1989.

The time dependent COMD event, observed at semiconductor laser diodes with standard passivation, can be completely suppressed by application of the in-situ passivation process described and claimed in the U.S. Pat. No. 5,063,173 with title "Method for Mirror Passivation of Semiconductor Laser Diodes", and the corresponding counterpart patents in various countries. For devices which were passivated in-situ, an absolute COMD level exists. The laser can be operated below this COMD level without any mirror damage, i.e., the laser devices which were passivated in-situ are very reliable. Lifetimes of up to 2½ years have been recorded under tough conditions in a long distance fiber link where the semiconductor lasers are employed as pump lasers in pump modules.

The above mentioned absolute COMD level depends on the physical properties of the passivation layer used. For increasing absorption the absolute COMD level moves downward. In today's semiconductor lasers, damages and/or degradation at the laser facet where the light wave is decoupled from the standing light wave within the laser's cavity occur due to the relatively high intensity at the facet.

To the best of our knowledge, semiconductor lasers so far built or reported, still suffer from a number of deficiencies:

Continuous operation output powers of above 200 mW are still not possible for an extended period of time;

There is still room for improvement of the device lifetimes.

It is a main object of the present invention to provide reliable semiconductor diode lasers and a method for the fabrication of reliable semiconductor diode lasers.

It is another object of the present invention to provide high-power, long lifetime, high performance semiconductor diode lasers and a method for the fabrication of such high-power, long lifetime, high performance semiconductor diode lasers.

SUMMARY OF THE INVENTION

The invention as claimed is intended to meet these objectives and to remedy the deficiencies of known semiconductor laser diodes and known fabrication techniques. The inventive method solves the problems hitherto encountered in that a stack of layers is deposited on the facets of a semiconductor diode laser such that the light intensity at laser facet where the light wave is decoupled from the standing light wave within the laser cavity is reduced. The stack of layers provides for a phase shift of the standing wave inside the laser such that the light wave is decoupled at the minimum of the standing wave.

The main advantages offered by the invention are that semiconductor laser diodes fabricated in accordance with the inventive process, have a significantly increased COMD level and exhibit a substantially improved degradation behavior, resulting in very high power lasers of superior reliability and thus increased lifetime.

DESCRIPTION OF THE DRAWINGS

The invention is described in detail below with reference to drawings which illustrate a specific embodiment as well as performance characteristics of devices fabricated in accordance with the teaching of the invention, and in which.

DETAILED DESCRIPTION

Before describing the invention in greater detail, the purpose and the basic concept underlying the invention will be briefly outlined.

Figure 1:
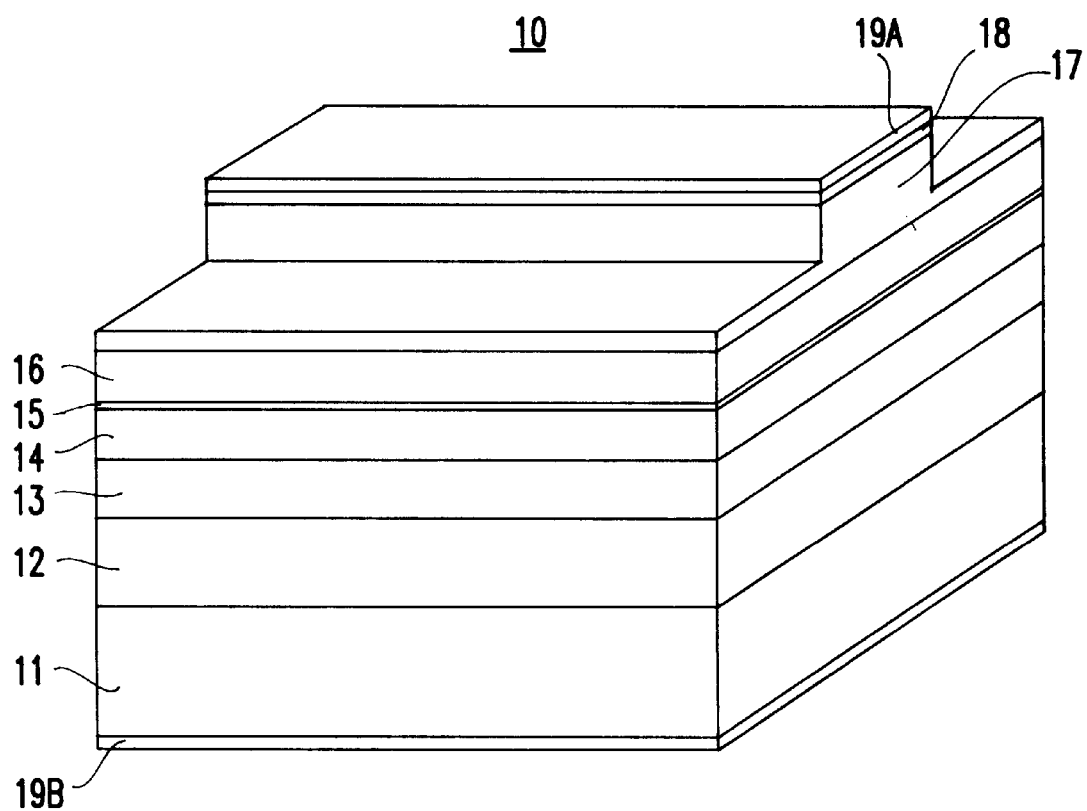
FIG. 1 is a perspective view of a laser bar having a ridge GRINSCH structure to which the inventive method can be applied.

The present invention is based on the idea of using a stack of layers, deposited on one or both of the laser facets, to obtain a phase shift of the standing light wave in the laser's waveguide. It has been demonstrated by the inventors, that due to a suited phase shift, a power reduction at the interface between the laser facet and the waveguide can be achieved. The principle of the present invention will now be described with help of FIGS. 2 and 3. For sake of simplicity, the reference numbers of FIG. 1 are also used in FIGS. 2 and 3.

Figures 2A, 2B:
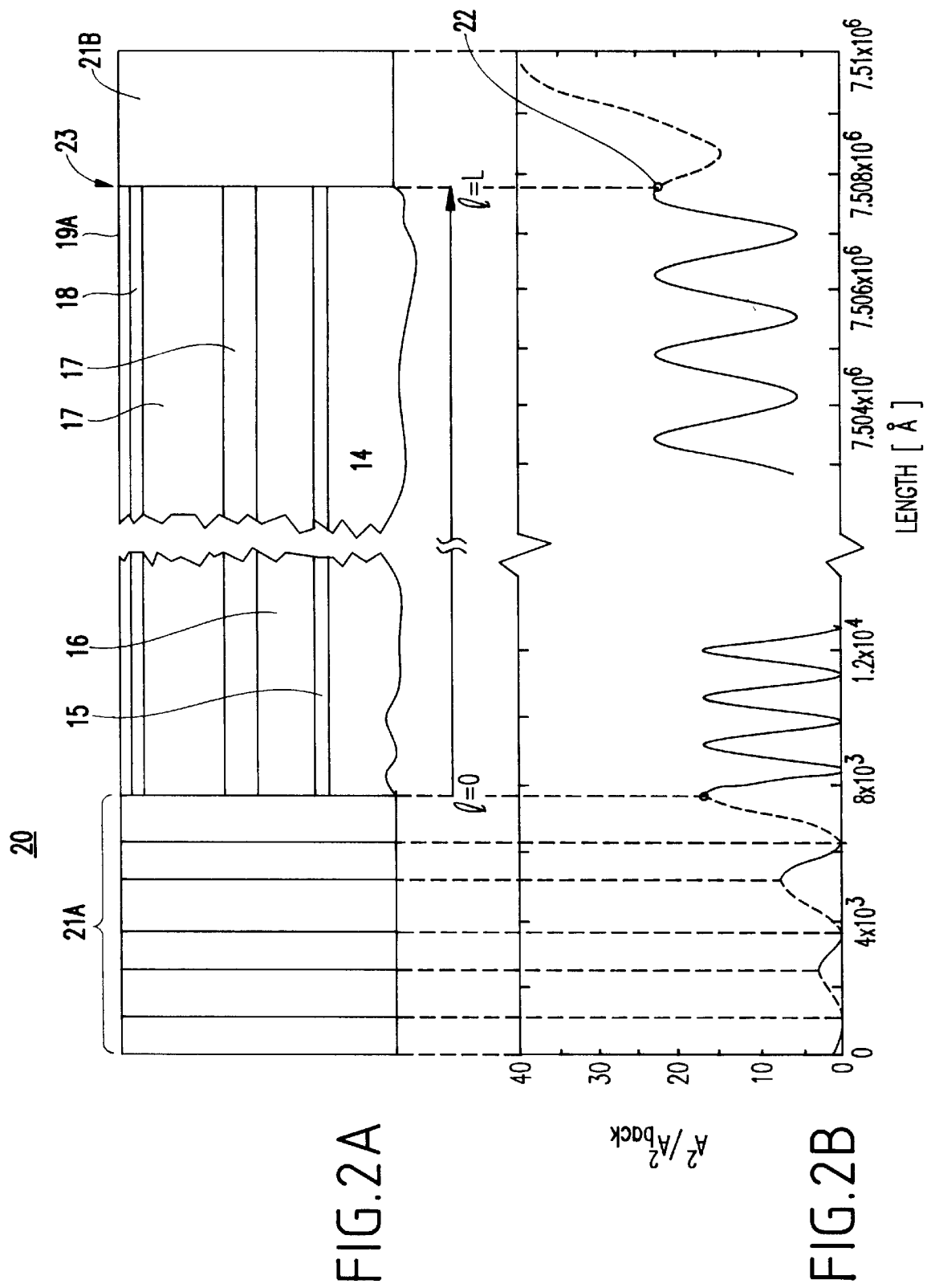
FIG. 2A is a schematic cross-section of the ridge waveguide of a semiconductor laser diode with conventional reflectivity modifications layers formed on the laser facets.
FIG. 2B is a schematic diagram illustrating the amplitude squared versus the cavity length L of a semiconductor laser diode with conventional reflectivity modifications layers formed on the laser facets.

In FIG. 2A, the ridge waveguide of a semiconductor laser diode 20, which was part of the laser bar 10 (see FIG. 1) with conventional reflectivity modifications layers 21A and 21B is shown. Such conventional reflectivity modification layers 21A and 21B usually consist of a stack of quarter wavelength layers. In FIG. 2B, the squared amplitude of the standing light wave inside the cavity of the laser 20 is shown. In this Figure, the squared amplitude as function of the position I is given. As can be seen in FIG. 2B, decoupling of the light wave is done in an intensity maximum (circle 22) of the standing wave at the front facet 23 of the laser diode 20. As a consequence of this, the highest possible power density appears at the critical interface 23 between the waveguide inside the laser 20 and the laser front facet coating 21B. It has been demonstrated that COMD occurs right at this critical interface 23.

Figures 3A, 3B:
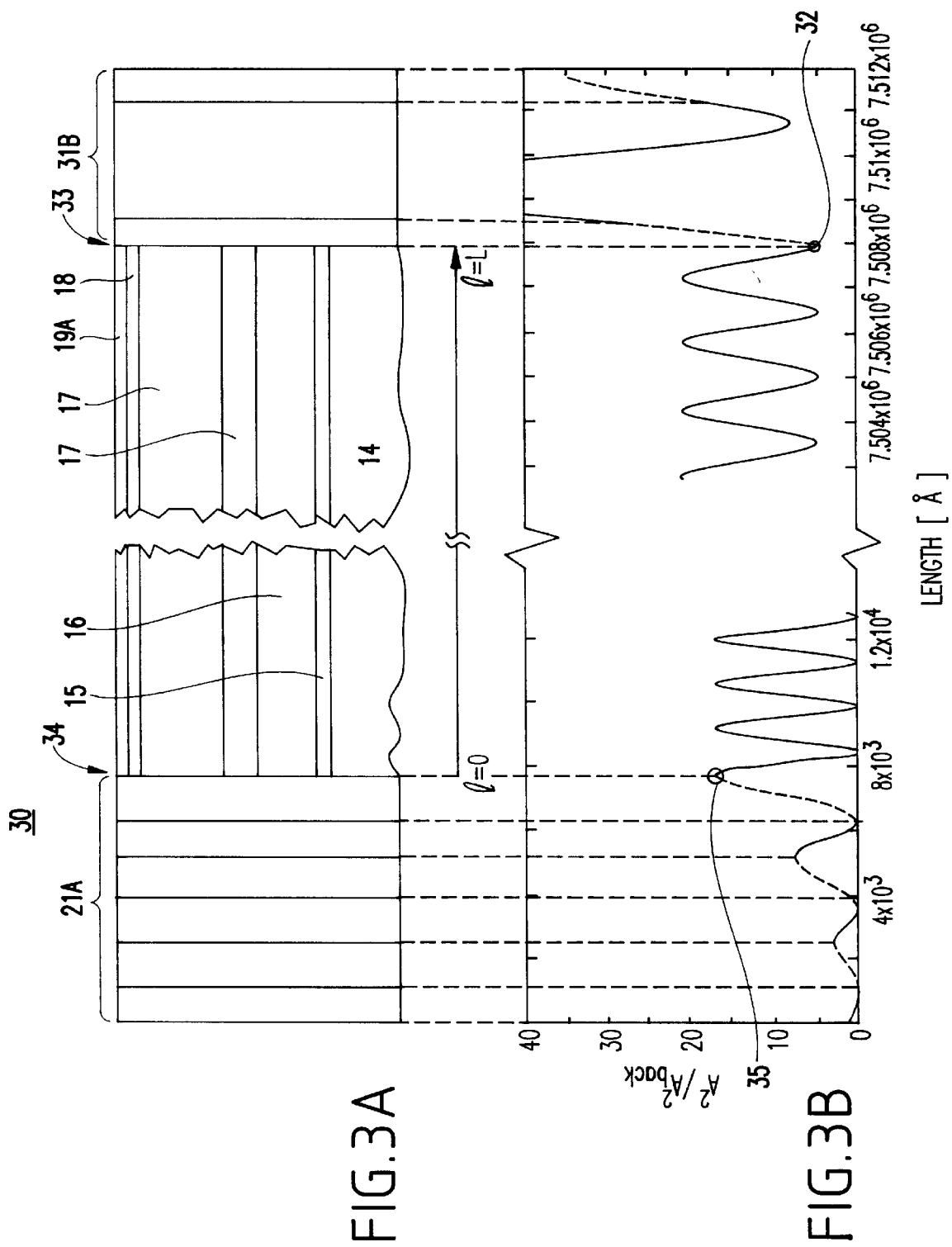
FIG. 3A is a schematic cross-section of the ridge waveguide of a semiconductor laser diode with an inventive stack of reflectivity modifications layers formed on the laser facets.
FIG. 3B is a schematic diagram illustrating the amplitude squared versus the cavity length L of a semiconductor laser diode with an inventive stack of reflectivity modifications layers formed on the laser facets.

By application of a stack of phase shifting reflectivity modification layers 31B, as illustrated in FIG. 3A, the decoupling of the light wave is shifted to the intensity minimum (circle 32) of the standing wave, as illustrated in FIG. 3B. In a laser 30 comprising the inventive stack of phase shifting reflectivity modification layers 31B, the rear facet 34 instead of the front facet 33 experiences the higher power (circle 35). Please note, that on the rear facet conventional reflectivity modifications layers 21A are employed. This means that the COMD no longer appears at the front facet 33, but is observed at the rear facet 34.

By means of an adequate stack of phase shifting reflectivity modification layers also formed on the rear facet, allows decoupling at almost zero intensity, such that the 'weakest' point again would appear at the front facet 33.

It has been shown, that the total reduction in intensity at the critical interface is a factor of 4–5 for today's lasers with 10%/90% reflectivity modification layers. Laser diodes having inventive phase shifting reflectivity modification layers either on the front facet or on the front and back facets showed drastically improved reliability. Even if ramped into COMD, no damage was found at the front facet. Due to the present invention, high power, semiconductor laser diodes of 1 W and more can be realized.

In the following, important steps in the fabrication process of AlGaAs (or other III/V compound) semiconductor laser diodes, according to the present invention, are described. The preparation of the laser facets (mirrors) is usually done by cleaving. Instead of cleaving the facets, they can also be made by means of etching. Details of the fabrication process of an AlGaAs laser are given in the above mentioned U.S. Pat. No. 5,063,173 which is herewith incorporated by means of reference.

First, a laser bar is produced, i.e., an epitaxially grown layered structure forming a waveguide which, when both its ends are terminated with a mirror facet, serves as the laser cavity. Such bar structure 10 is schematically shown in FIG. 1. It can be the same and fabricated using the same process as that described in an article by C. Harder et al, entitled "High-Power Ridge-Waveguide AlGaAs GRINSCH Laser Diode", published in Electronics Letters, 25th Sep. 1986, Vol.22, No.20, pp 1081–1082.

Briefly, the sequence of steps for producing the layered structure 10 is as follows:

The layers are grown on an n+-doped GaAs substrate 11 by, e.g., molecular beam epitaxy (MBE). First, an n-doped GaAs buffer layer 12 is grown on the substrate. Next is a lower, n-type AlGaAs cladding layer 13. The core of the laser consists of a graded n-type AlGaAs region 14, an undoped region 15, forming a GaAs quantum well, and a graded p-type AlGaAs region 16. Next is the AlGaAs top cladding layer 17, followed by a p+-GaAs contact layer 18 with a doping density that is high enough for a titanium-platinum-gold electrode 19A to make good ohmic contact. Another ohmic contact 19B, at the bottom of the n-type substrate 11, is obtained by alloying germanium, gold and nickel, for example.

When needed for lateral waveguiding, a ridge having a width of a few $\mu$m can be formed on top of the structure 10, as shown in FIG. 1, prior to applying the metal contact electrodes. The ridge is obtained by first applying a photoresist mask to define the ridge. Subsequently, 1 or 2 $\mu$m of the exposed top layers are etched, etching being stopped above the graded-index part of the the top cladding layer.

A cell comprising several laser bars (one such laser bar 10 is shown in FIG. 1), mounted in a carrier, for example, may now be placed in a UHV (ultrahigh-vacuum) chamber. After having cleaved the laser bars in order to provide cleaved laser facets, a suited passivation layer(s) may now be deposited onto the cleaved facet(s), as described in U.S. Pat. No. 5,063,173, for example. With the deposition of the passivation layer(s) the fabrication of a conventional laser diode is completed.

Next, phase shifting reflectivity modification layers are either deposited on the front facet, or on the front and rear facets. The front facet reflectivity of 10%, including the phase shift according to the present invention, can be obtained by sputter deposition of the following three-layer stack 31B, for example: 600 Å $TiO_2$ (n=2.455), 2700 Å $Al_2O_3$ (n=1.65), and 600 Å $TiO_2$ (n=2.455).

The standard six-layer stack 21A for a 90% back facet reflectivity can also be produced by sputter deposition of the following layer sequence: 1476 Å $Al_2O_3$ (n=1.65), 998 Å $TiO_2$ (n=2.455), 1655 Å $SiO_2$ (n=1.48), 998 Å $TiO_2$ (n=2.455), 1655 Å $SiO_2$ (n=1.48), and 998 Å $TiO_2$ (n=2.455).

The application of the present invention is not limited to cleaved mirror devices. Any mirror facet can be processed in accordance with the present invention.

A process for fabricating high power etched mirror lasers with a stack of layers, according to the present invention can comprise the following process steps:

Fabrication of the basic layered laser structure (as described in C. Harder et al, cited above);

Dry etching to produce the etched mirror facets (as described in European patent 363547, issued on 29 Dec. 1993 and assigned to the present applicant);

Sputter cleaning of the etched facets to remove residuals of the etching process, e.g., with nitrogen/hydrogen ions, at 800 V and a pressure of 0.4 Pa, followed by annealing to remove surface defects;

e-beam evaporation of a 1 nm Si passivation film, and sputter deposition of a stack of layers providing for the phase shift according to the present invention.

The invention has been described in detail as applied to the fabrication of specific AlGaAs ridge diode lasers with either cleaved or etched mirrors. It should, however, be understood that it is likewise applicable to other laser diode structures, and to devices consisting of compound semiconductors other than AlGaAs. Also, processes and device parameters may be different from those indicated herein above.

We claim:

1. A semiconductor laser diode, comprising:
   a waveguide being terminated by a back facet and a front facet; and
   a front facet coating and a back facet coating having a reflectivity providing for controlled decoupling of light at said front facet from a standing lightwave in said waveguide,
   wherein said front facet coating comprises a stack of layers providing for a phase shift of said standing lightwave within said waveguide such that the intensity of the standing lightwave at said front facet, where said light is decoupled from said standing lightwave, has a relative minimum,
   wherein said stack of layers of said front facet coating includes first, second and third layers, and wherein refractive indices of said first and third layers are greater than that of said second layer so as to reduce catastrophic optical mirror damage (COMD).

2. The laser diode of claim 1, wherein said back facet coating also comprises a stack of layers providing for a phase shift of said standing lightwave within said waveguide such that the intensity of the lightwave at said back facet, where said lightwave is reflected back into the waveguide, has a relative minimum.

3. The laser diode of claim 1 or 2, wherein said stack of layers comprises $TiO_2$ and/or $Al_2O_3$ layer(s).

4. The laser diode of claim 1, wherein said stack of layers comprised in said front facet coating has a reflectivity of about 10%.

5. The laser diode of claim 2, wherein said stack of layers comprised in said back facet coating has a reflectivity of about 90%.

6. The laser diode of claim 1, wherein said stack of layers comprises the following three layers:

600 Å $TiO_2$ (n=2.455),
   2700 Å $Al_2O_3$ (n=1.65), and
   600 Å $TiO_2$ (n=2.455).

7. The laser diode of claim 1, having cleaved and/or etched facets.

8. The laser diode of claim 1, being a ridge waveguide laser, a broad area laser, or a buried waveguide laser.

9. The laser diode of claim 1, being a high power laser diode having a power of no less than 1 W.

10. The laser diode of claim 1, wherein said front facet coating comprises a thin passivation layer in direct contact with said front facet.

11. The laser diode according to claim 1, wherein said first and third layers are formed of the same material.

12. The laser diode according to claim 11, wherein said first layer is formed of $TiO_2$, said second layer is formed of $Al_2O_3$, and said third layer is formed of $TiO_2$.

13. The laser diode of claim 12, wherein said stack of layers comprises the following three layers:

600 Å $TiO_2$ (n=2.455),
   2700 Å $Al_2O_3$ (n=1.65), and
   600 Å $TiO_2$ (n=2.455).

14. The laser diode of claim 13, wherein said back facet coating also comprises a stack of layers providing for a phase shift of said standing lightwave within said waveguide such that the intensity of the lightwave at said back facet, where said lightwave is reflected back into the waveguide, has a relative minimum.

15. The laser diode according to claim 14, wherein said stack of layers of said back facet coating includes first, second and third layers, said first and third layers being formed of the same material.

16. The laser diode according to claim 15, wherein said first layer of said back facet coating is formed of $TiO_2$, said second layer of said back facet coating is formed of $Al_2O_3$, and said third layer of said back facet coating is formed of $TiO_2$.

* * * * *